United States Patent [19]

Schultz

[11] Patent Number: 5,155,450
[45] Date of Patent: Oct. 13, 1992

[54] INTERFACE CIRCUIT
[75] Inventor: Warren J. Schultz, Tempe, Ariz.
[73] Assignee: Motorola, Inc., Schaumburg, Ill.
[21] Appl. No.: 812,385
[22] Filed: Dec. 23, 1991
[51] Int. Cl.[5] .......................... H03F 1/02; H03F 3/45
[52] U.S. Cl. ....................................... 330/301; 330/9; 73/862.63; 73/862.622
[58] Field of Search ........... 73/862.63, 862.64, 862.68; 330/9, 252, 258, 301, 310, 311

[56] References Cited

U.S. PATENT DOCUMENTS 4,720,686  1/1988  Westwick ..................... 330/301 X
5,012,436  4/1991  Burri ................................. 330/9 X
5,048,343  9/1991  Oboodi et al. ................... 73/862.63

Primary Examiner—Steven Mottola
Attorney, Agent, or Firm—Michael D. Bingham

[57] ABSTRACT

A circuit for interfacing with the outputs of a differential pressure sensor provides a single-ended output voltage translated in voltage level with respect to the differential voltage applied thereto from the sensor while cancelling the common mode offset voltage of the sensor so that the output voltage is independent of the common mode offset voltage. The circuit includes four operational amplifiers arranged as a differential-to-single ended converter with gain.

6 Claims, 1 Drawing Sheet

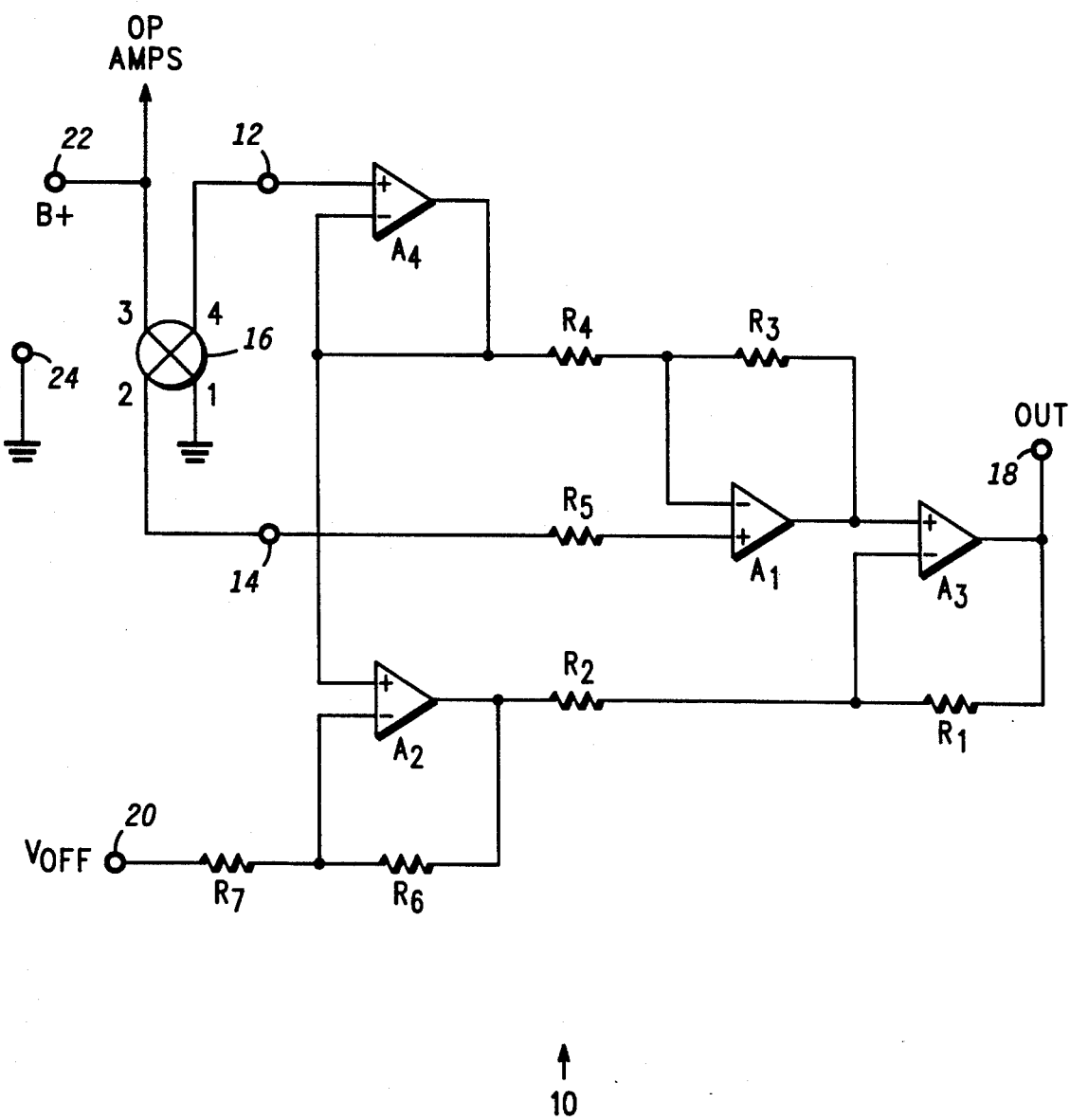

INTERFACE CIRCUIT

BACKGROUND OF THE INVENTION

The present invention relates to an interface circuit for providing a translated single-ended output signal level responsive to an applied differential input signal of a different level and, more particularly, to a circuit for interfacing to differential compensated silicon sensors while providing a translated single-ended output level signal that is independent of zero pressure common mode output signal level of the sensor.

Temperature compensated differential pressure sensors are well knwon in the art for measuring the difference between pressures applied simultaneously to opposite sides of a diaphragm of the sensor to produce a differential output voltage at respective outputs. Such a pressure sensor is the MPX2000 family of pressure sensors manufactured by Motorola, Inc. In general such sensors provide a given output voltage over a range of several tens of millivolts as the pressure applied thereto is increased from zero to the full scale pressure range of the sensor. Further, all known differential pressure sensors produce a common mode output voltage at zero applied pressure.

In many applications the full scale output voltage range of the aforedescribed pressure sensors may be too small to be utilized without translating this voltage to a higher level. Instrumentation amplifiers have been used in the past to interface with these type sensors in order to provide a translated output signal. Although instrumentation amplifiers fulfill some needs, they also suffer from problems that need to be addressed. Typically, instrumentation amplifiers require both positive and negative power supplies wherein many applications require only the use of a single power supply. In addition, in many microprocessor applications, an interface circuit must be able to translate the differential sensor output voltage level to the required microprocessor input voltage level while providing a known voltage offset to the input of the microprocessor at zero differential pressure. Instrumentation amplifiers in general can not provide a zero pressure offset voltage offset which is independent of the common mode offset voltage of the sensor.

Thus, a need exists for a single power supply interface circuit for use with available differential pressure sensors which can provide a zero pressure output voltage that is independent of the sensor common mode offset voltage.

SUMMARY OF THE INVENTION

Accordingly, there is provided an interface circuit for translating the voltage level of an applied differential input voltage to a single-ended output voltage of a different level which includes a plurality of interconnected operational amplifiers comprising a first operational amplifier having and a first input coupled to a first input of the circuit and a second input coupled via an unity gain amplifier to a second input of the circuit; a second operational operational having a first input coupled with the second input of the first operational amplifier and a second input; a third operational amplifier having a first input coupled to the output of the first operational amplifier and an output coupled to an output of the circuit at which the single-ended output voltage is provided; first and second resistors serially connected between an additional input of the circuit and the output of the second operational amplifier with the interconnection therebetween being connected to the second input of the second operational amplifier and third and fourth resistors serially coupled between the outputs of the second and third operational amplifiers with the interconnection therebetween being connected to the second input of the third operational amplifier.

It is one aspect of the invention that the differential input signal is provided from a compensated differential pressure sensor wherein at zero pressure applied across the sensors a common mode voltage appears across the inputs of the circuit. By making the ratio of the second and first resistors of the circuit equal to the ratio of the third and fourth resistors the output voltage of the circuit can be set to an predetermined value that is independent of the aforementioned zero pressure common mode voltage.

BRIEF DESCRIPTION OF THE DRAWING

The single FIGURE is a schematic diagram illustrating a preferred embodiment of the present invention.

DETAILED DESCRIPTION OF THE PREFERRED EMBODIMENT

Turning to the sole FIGURE there is shown interface circuit 10 of the present invention which has input terminals 12 and 14, an output terminal 18 and a voltage offset input terminal 20. In general, circuit 10 translates a differential input signal applied at inputs 12 and 14 of a first level to a single-ended output signal of a second level as will be described. More particularly, interface circuit 10 is suited to be coupled to temperature compensated pressure sensor 16 at inputs 12 and 14. Pressure sensor 16 can be a commercially available sensor, for example, the MPX 2000 family of sensors. Typically, the aforementioned sensor provides a full scale differential voltage output at terminals 2 and 4 of 20 mV over its full scale pressure range. In addition, at zero pressure, sensor 16 has an associated common mode output voltage that appears at the two output terminals thereof that are coupled to inputs 12 and 14 of interface circuit 10. Interface circuit 10 translates the differential voltage applied thereto to a single-ended output voltage over the pressure range of the sensor to a second or different level as will be described while setting the zero pressure output voltage at output 18 to a value that is independent of the common mode voltage of sensor 16.

Interface circuit 10 includes a first operational amplifier A1 having a non-inverting input coupled via resistor $R_5$ to input terminal 14, a feedback resistor $R_3$ coupled between the output and the inverting input thereof for setting the gain of the amplifier. A unity gain or buffer amplifier comprising operational amplifier $A_4$ is coupled between input 12 and the inverting input of $A_1$ via resistor $R_4$ and also to the non-inverting input of operational amplifier $A_2$. The output of amplifier $A_1$ is coupled to the non-inverting input of operational amplifier $A_3$ the output of which is coupled to output terminal 18. The output of $A_3$ is also returned to its inverting input via resistor $R_1$ and via the series connected resistors $R_1$ and $R_2$ to the output of amplifier $A_2$. The output of amplifier $A_2$ is returned via resistor $R_6$ to its inverting input and via the series connected resistors $R_6$ and $R_7$ to voltage offset input terminal 20. A power supply is connected at terminals 22 and 24 for providing operating potential B+ to sensor 16 as well as the four operational amplifiers $A_1$–$A_4$. The four operational amplifiers may be any commercially available amplifiers, for example, the MC 33274 operational bipolar amplifiers which are available in quad package as manufactured by Motorola, Inc. One feature of the operational amplifiers is that they can both source and sink currents at their outputs. It is understood however, that interface circuit 10 is suited to be integrated as one monolithic integrated circuit or assembled as a circuit utilizing discrete resistive elements and the single MC33274 quad amplifier package.

A novel feature of interface circuit 10 is that the output voltage appearing at output 18 can be set at a desired level at zero pressure applied to sensor 16 which output voltage is independent of the common mode offset voltage of the sensor. If the ratio of resistors $R_1$, $R_2$, $R_6$ and $R_7$ are such that:

$$R_6/R_7 = R_2/R_1$$

then, $V_{out}$ at output terminal 18 will equal the value of the offset voltage, $V_{OFF}$, applied to terminal 20; independent of the common voltage produced across terminals 2 and 4 of sensor 16 at zero pressure. Assuming, for explanation purposes only, that $R_1$, $R_2$, $R_6$ and $R_7$ are equal value resistors and that $V_{OFF}$ applied to input terminal 20 is set a 0.5 volts. Now, if the common mode voltage offset of sensor 16 is, for instance, 2.5 volts this means that 2.5 volts is applied at both terminals 12 and 14. Since amplifier $A_4$ has unity gain, this means that its output will also be at 2.5 V. Therefore, 2.5 V is applied to the non-inverting input of $A_2$ which forces the inverting input thereof to also be at 2.5 V. Hence, 2.0 volts are dropped across $R_7$. Amplifier $A_2$ therefore will source a current via resistors $R_6$ and $R_7$ to terminal 20 and, since these resistors are equal value means that a voltage of 2.0 volts is dropped across $R_6$, whereby the output of amplifier $A_2$ is set to approximately 4.5 V. This forces the output of $A_3$ to sink a current at its output via resistors $R_1$ and $R_2$ from $A_2$ such that 2.0 volts are dropped across each of the resistors. Hence, the voltage level at the output 18 will be forced to 0.5 volts which is equal to $V_{OFF}$ and is independent of the common mode voltage of sensor 16.

A novel aspect of the present invention is that interface circuit 10 can provide a single-ended direct interface between differential pressure sensor 16 and a microprocessor. For instance, many available microprocessors have an analog-to-digital input capable of receiving a single-ended analog signal in the 0.5 volts to 4.5 volts range. Hence, if the gain of $A_1$ and $A_3$ is 100 and 2 respectively, the full scale voltage span over the pressure range of sensor 16 will be translated up from 20 millivolts at the output of the sensor to approximately 4.5 volts at output 18 of circuit 10. Thus, the output voltage of interface circuit 10 varies from 0.5 volts to 4.5 volts as is necessary to drive most microprocessors, assuming $V_{OFF}$ is set at 0.5 volts.

Thus, what has been described is a novel interface circuit suited to translate the voltage output level of a differential pressure sensor to a higher voltage output level at the output of the circuit in which the offset voltage of the circuit can be set to any desired value for zero differential pressure that is independent of the sensor common mode voltage.

What is claimed is:

1. An interface circuit for providing a single-ended output voltage at an output responsive to a differential signal applied to first and second inputs thereof, comprising:

a first operational amplifier ($A_1$) having first and second inputs and an output, said first input being coupled to the first input of the circuit;

a second operational amplifier ($A_2$) having first and second inputs and an output;

an unity gain amplifier ($A_4$) coupled between the second input of the circuit and both said second input of said first operational amplifier and said first input of said second operational amplifier;

a third operational amplifier ($A_3$) having first and second inputs and an output, said first input being coupled to said output of said first operational amplifier and said output being coupled to the output of the circuit;

first and second resistive means serially coupled between a third input of the interface circuit and said output of said second operational amplifier, an interconnection therebetween being coupled to said second input of said second operational amplifier; and third and fourth resistive means series coupled between said output of said second operational amplifier and said output of said third operational amplifier, an interconnection therebetween being coupled to said second input of said third operational amplifier.

2. The circuit of claim 1 including fifth and sixth resistive means serially coupled between said unity gain amplifier and said output of said first operational amplifier with an interconnection therebetween being coupled to said second input of said first operational amplifier.

3. The circuit of claim 2 wherein the ratio of said second resistive means to said first resistive means is substantially equal to the ratio of third resistive means to said fourth resistive means.

4. An interface circuit for translating the differential output voltage level of a pressure sensor applied to first and second inputs of the circuit to a single-ended output voltage of a different level at an output of the circuit while providing a zero pressure offset voltage at the output that is independent of the sensor common mode voltage, comprising:

an unity gain amplifier having an input coupled to the first input of the circuit and an output;

a first operational amplifier having a predetermined gain and having first and second inputs and an output, said first input being coupled to the second input of the circuit and said second input being coupled to said output of said unity gain amplifier;

a second operational amplifier having first and second inputs and an output, said first input being coupled to said output of said unity gain amplifier;

a third operational amplifier having a predetermined gain and having first and second inputs and an output, said first input being coupled to said output of said first operational amplifier and said output being coupled to the output of the circuit;

first and second resistive means serially coupled between a third input of the interface circuit to which an offset voltage is applied and said output of said second operational amplifier, an interconnection therebetween being coupled to said second input of said second operational amplifier; and third and fourth resistive means series coupled between said output of said second operational amplifier and said output of said third operational amplifier, an interconnection therebetween being coupled to said second input of said third operational amplifier, wherein the ratio of said second and first resistive means is equal to the ratio said third and fourth resistive means.

5. The circuit of claim 4 including fifth resistive means coupled between said output and said second input of said first operational amplifier.

6. The circuit of claim 5 including:
sixth resistive means coupled between said output of said unity gain amplifier and said second input of said first operational amplifier; and
seventh resistive means coupled between the second input of the circuit and said first input of said first operational amplifier.

* * * * *